(12) United States Patent
Coyne et al.

(10) Patent No.: US 10,468,484 B2
(45) Date of Patent: Nov. 5, 2019

(54) BIPOLAR TRANSISTOR

(71) Applicant: ANALOG DEVICES GLOBAL, Hamilton (BM)

(72) Inventors: Edward John Coyne, Galway (IE); William Allan Lane, Cork (IE); Seamus P. Whiston, Limerick (IE)

(73) Assignee: Analog Devices Global, Hamilton (BM)

( * ) Notice: Subject to any disclaimer, the term of this patent is extended or adjusted under 35 U.S.C. 154(b) by 23 days.

(21) Appl. No.: 14/284,148

(22) Filed: May 21, 2014

(65) Prior Publication Data
US 2015/0340440 A1 Nov. 26, 2015

(51) Int. Cl.
| | | |
|---|---|---|
| H01L 29/08 | (2006.01) |
| H01L 29/732 | (2006.01) |
| H01L 29/45 | (2006.01) |
| H01L 29/10 | (2006.01) |
| H01L 29/423 | (2006.01) |
| H01L 29/66 | (2006.01) |
| H01L 29/06 | (2006.01) |

(52) U.S. Cl.
CPC ...... *H01L 29/0821* (2013.01); *H01L 29/0649* (2013.01); *H01L 29/1004* (2013.01); *H01L 29/42304* (2013.01); *H01L 29/45* (2013.01); *H01L 29/66272* (2013.01); *H01L 29/732* (2013.01)

(58) Field of Classification Search
None
See application file for complete search history.

(56) References Cited

U.S. PATENT DOCUMENTS

| | | | | |
|---|---|---|---|---|
| 5,332,920 A | * | 7/1994 | Nakagawa | H01L 21/761 257/140 |
| 5,557,134 A | * | 9/1996 | Sugisaka | H01L 21/3226 257/506 |
| 7,795,681 B2 | * | 9/2010 | Williams | H01L 21/761 257/349 |
| 8,058,704 B2 | | 11/2011 | Stenson et al. | |
| 2003/0001234 A1 | * | 1/2003 | Fujii | H01L 21/8249 257/552 |
| 2004/0188797 A1 | * | 9/2004 | Khater | H01L 29/66242 257/510 |
| 2005/0020003 A1 | * | 1/2005 | Johansson | H01L 21/8249 438/207 |
| 2005/0062101 A1 | * | 3/2005 | Sugi | H01L 21/76283 257/330 |
| 2007/0045767 A1 | * | 3/2007 | Zhu et al. | 257/505 |
| 2007/0176220 A1 | * | 8/2007 | Takahashi | H01L 29/0692 257/301 |
| 2013/0009272 A1 | * | 1/2013 | Sakurai | H01L 21/84 257/496 |

* cited by examiner

*Primary Examiner* — Samuel A Gebremariam
*Assistant Examiner* — Jonas T Beardsley
(74) *Attorney, Agent, or Firm* — Knobbe, Martens, Olson & Bear, LLP

(57) ABSTRACT

A modified bipolar transistor is provided which can provide improved gain, Early voltage, breakdown voltage and linearity over a finite range of collector voltages. It is known that the gain of a transistor can change with collector voltage. This document teaches a way of reducing this variation by providing structures for the depletion regions with the device to preferentially deplete with. As a result the transistor's response can be made more linear.

22 Claims, 15 Drawing Sheets

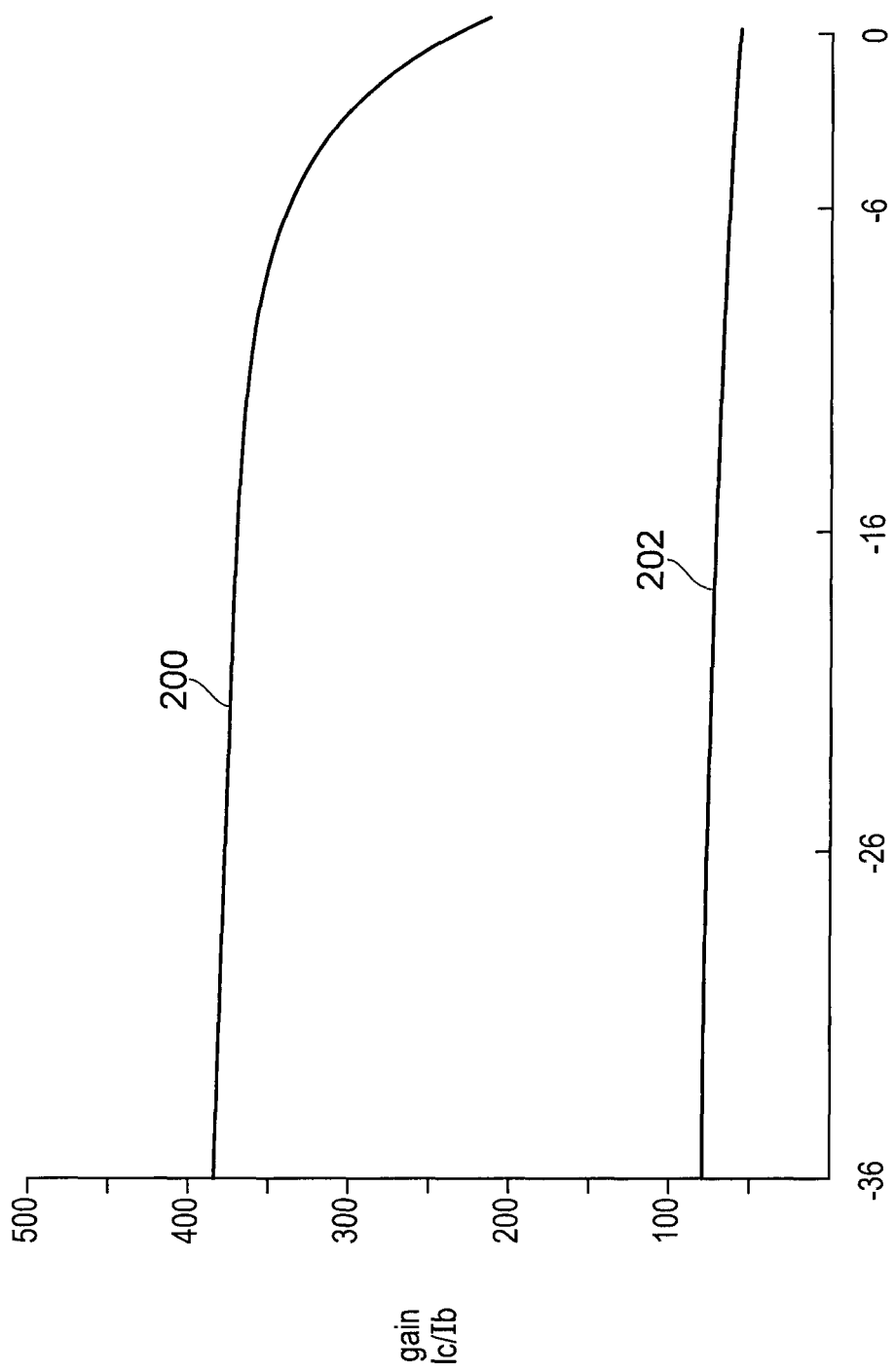

BIPOLAR TRANSISTOR

FIELD

This disclosure relates to a transistor having a modified structure. Such a structure can reduce the variation in collector current as a result of changes in collector voltage.

BACKGROUND

Transistors are used for many purposes. When used as amplifiers, high gain is often desirable. However, it can be desirable for such a transistor to be substantially linear as non-linearity can introduce distortion, and it is typically desirable that the gain of a transistor should not change in response to operating conditions such as collector-emitter voltage Vce. This is generally indicated by a transistor exhibiting a relatively large "Early" voltage.

The Early effect (named after its discoverer James Early) describes how an effective width of a base region of a bipolar transistor changes with collector-emitter voltage. The width of the base affects the gain of the transistor. Consequently the gain of a transistor can vary with the instantaneous amplitude of a signal. If the signal was a sinusoid then the gain applied to the peak of the sinusoid would be different to the gain applied to the trough of the sinusoid, which gives rise to harmonic distortion

SUMMARY

According to an aspect of this disclosure there is provided a bipolar transistor having a charge control means, such as a charge control structure provided adjacent a base-collector interface. Such a charge control structure can reduce variation in the width of the base as a result of changes in collector voltage.

It is thus possible to provide a transistor that has improved linearity.

When a transistor is operating as an amplifier, the collector current may vary quite significantly in response to changes in base-collector voltage due to the "Early effect", and hence this causes the gain to vary with the near instantaneous collector voltage. This can give rise to different portions of a sinusoidal signal being subjected to different amounts of gain. A charge control structure as disclosed herein can reduce the changes in collector current, and hence gain, as a function of collector voltage.

Advantageously the charge control structure is a structure provided as an electrode extending substantially in the same direction as the direction of current flow between the collector and the emitter regions of the transistor. For example, in a vertical transistor where an emitter is formed above a collector, the electrode or electrodes of the charge control structure extend vertically.

Preferably the charge control structure is separated from the collector of the transistor by an insulating region such that there is no significant current flow between the charge control structure and the collector or base regions of the transistor. The insulating region preferably comprises a layer of a dielectric material. The dielectric may be selected to be a dielectric readily available within a semiconductor fabrication process. Such dielectrics include nitrides and oxides.

Additionally or alternatively the charge control structure may comprise a region of oppositely doped semiconductor formed adjacent but to the side of the base-collector interface.

According to a second aspect of this disclosure there is provided a method of modifying the response of transistor to gain changes as a result of changes in collector-base voltage, comprising providing charge control structure adjacent an interface between the collector and base regions of the transistor.

BRIEF DESCRIPTION OF THE DRAWINGS

Embodiments of transistors in accordance with this disclosure will now be described by way of non-limiting example, with reference to the accompanying drawings, in which:

FIG. 9 is a plot of gain versus collector-emitter voltage for a prior art transistor and a transistor in accordance with this disclosure;

DETAILED DESCRIPTION OF CERTAIN EMBODIMENTS

As noted earlier, it can be beneficial for transistors to exhibit a linear gain characteristic versus voltage across the transistor. For transistors operated in a voltage gain mode (for example, where a resistor or a resonator is connected to the collector of the transistor), the collector voltage may vary significantly in use and such variations can give rise to undesirable changes in transistor gain. Because transistors can be quite complex, it is beneficial to briefly review the structure of a conventional bipolar junction transistor before discussing embodiments of improved transistors in accordance with this disclosure.

As used herein the terms "above", "below", "to the side of" and so on refer to components or regions as set out in the accompanying figures, and are not intended to be limiting of real world devices.

Figure 1:
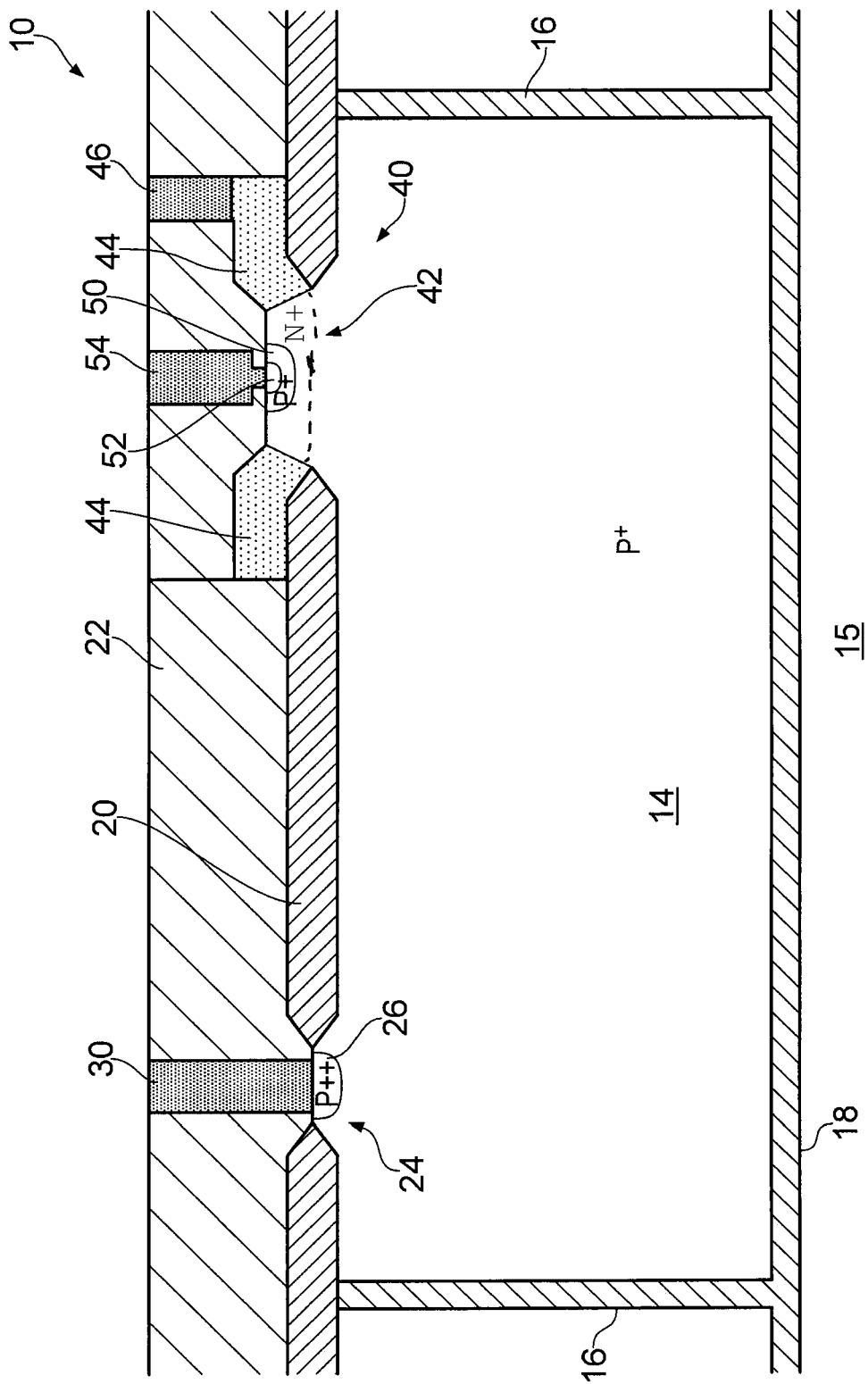
FIG. 1 is a schematic cross-section of a bipolar transistor.

FIG. 1 is a diagrammatic representation of a vertical PNP bipolar transistor. The transistor is not drawn to scale, and the features around the base and emitter regions have been drawn disproportionately large to show their structure. It should be noted that with a suitable change of doping NPN transistors can be formed.

The transistor, generally designated 10 is formed by a bulk region 14 of P+ doped semiconductor which is electrically isolated from a substrate 15 and from neighboring transistors, except by way of deliberate device interconnections made in a patterned metal layer as known to the person skilled in the art. The bulk region 14 may be formed within a well bounded by oxide layers 16 to the side of it and 18 beneath it. This approach is well known to the person skilled in the art of silicon on insulator (SOI) fabrication, or more generally in the art of semiconductor on insulator fabrication. Alternately, the bulk region 14 could be provided within one or more further doped regions that form reverse biased p-n junctions.

The transistor 10 comprises collector, base and emitter regions, and connections to each of these regions. The connections are made through apertures formed in an insulating layer 20, such as an oxide deposited or grown over an upper surface of the bulk material 14. Additional layers of insulating material may be deposited to form the structure of the prior art transistor, as known to the person skilled in the art. Such an additional layer, which may also be an oxide layer, for example of silicon oxide, is designated 22 in FIG. 1.

A collector contact is made by way of an aperture 24 formed in the insulating layer 20. During processing, the substrate 15 that includes the transistor 10 is subjected to implantation of acceptor impurities to form a highly doped region 26, which can be referred to as a $P^{++}$ region, to form a low resistance region to facilitate contact between the $P^+$ bulk region 14 and a metallic via 30 which is provided in the completed device. The metallic via 30 can serve as a contact to the collector of the transistor 10. The $P^{++}$ region 26 can also inhibit the formation of a Schottky barrier.

The base and emitter regions are formed adjacent a second aperture 40 formed in the insulating layer 20. The base region is often considered as being formed of two parts, which are generally known as an "extrinsic base" and an "intrinsic base".

In the arrangement shown in FIG. 1 the "intrinsic base" 42 lies generally intermediate the emitter 50 and the bulk region 14. The intrinsic base region may be formed by introducing impurity atoms through the aperture 40 to form an n-type base region 42, or an n-type semiconductor may be deposited by epitaxial growth so as to form a $N^+$ region in the aperture and extending proud of it to form the n type intrinsic base region 42.

Lateral connections are made to the intrinsic base region 42, by more relatively highly doped N type silicon regions 44. The regions 44 extend into and out of the plane of the drawing, and hence the regions 44 shown at either side of the aperture 40 may be electrically connected and in three dimensions may surround the emitter 50, for example, by forming a ring encircling the emitter 50 of the transistor 10. The region 44 is the extrinsic base of the transistor 10. The extrinsic base region 44 makes a contact with a via 46 that forms a connection to the interconnection layer (not shown) in the completed device. The via 46 is shown as being metallic, but it could be a doped semiconductor. The via 46 serves as a base contact in the illustrated transistor 10.

In practice, the intrinsic and extrinsic base regions can be deposited at the same time by epitaxial deposition. The silicon deposited above the aperture 40 sees the crystal lattice of the P type bulk region 14, and repeats this structure above the aperture 40 to form an intrinsic base region having a crystalline structure, whereas the silicon deposited over the oxide layer 20 does not see the crystal structure of the bulk region 14, and hence does not have a crystalline template structure to replicate, and instead forms amorphous silicon or polysilicon.

The region 44 beneath the via 46 may be heavily N type doped to avoid forming a Schottky barrier. The contact region can be relatively large and the base current should be significantly less than the collector current, so resistance should not be such a significant factor.

The emitter region may be formed by implanting a P+ region 50 into the base region. The P+ emitter region 50 encloses a highly doped P++ region 52 which does not act as the emitter as such, but forms a low resistance region to interface between the emitter region 50 and a metallic via 54 which forms a connection between the emitter region 50 and an interconnection layer above the surface of the device. The via 54 serves as an emitter contact in the transistor 10. In practice, these two implantation steps can be replaced by a single implantation where the heavily doped $P^{++}$ region 52 is formed and diffusion of this effectively gives rise to the emitter region 50 surrounding it.

Alternatively, the silicon which was deposited by epitaxial deposition during the formation of the base can be heavily P type doped in the emitter region to form the $P^{++}$ region 52 which, due to diffusion, may be surrounded by $P^+$ region 50. In general, the emitter region typically benefits from being as highly doped as possible.

The transistor 10 in FIG. 1 is a vertical device because the carrier flow is vertical in the emitter-base region, and continues vertically into the P type region beneath the intrinsic base region 42, it is only in a relatively deep region of the bulk region 14 that the current and/or carrier flow spreads out and makes its way towards the collector contact region 26.

Figure 2:
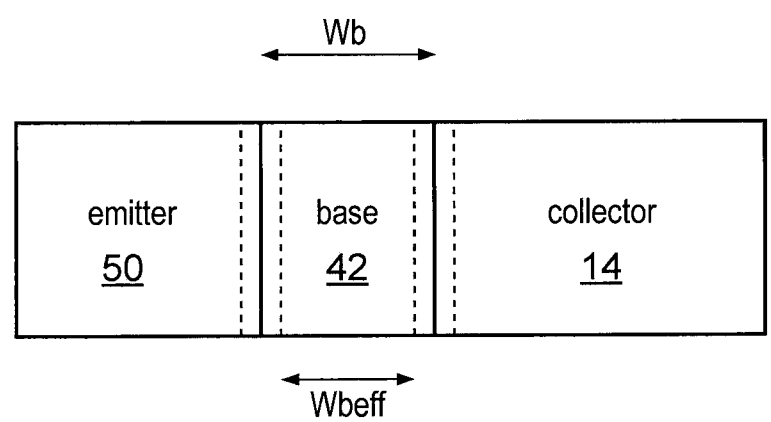
FIG. 2 diagrammatically illustrates how the base width can vary in response to the collector voltage of the transistor.

The p-n-p junction around the base region forms depletion regions. This is shown schematically in FIG. 2. For diagrammatic purposes we will assume that there is a sharp transition between the p and n type regions.

The base region 42 has a notional width Wb. However the depletion regions extend into the base region from its interfaces with the collector and emitter regions. These reduce the effective width of the base to become WBeff.

For a transistor in normal operation, the emitter-base junction is forward biased and to a first (and generally good) approximation the width of the depletion region at the base emitter interface does not change.

The base-collector junction is reverse biased, and hence the width of this junction changes with collector voltage, and the depletion region width can be approximated as $$Wd = (2\varepsilon V_{CB}/eN_B)^{1/2}$$

where:
  $\varepsilon$ is the dielectric value of the material
  $N_B$ is the doping concentration in the collector region
  e is the charge of an electron
  $V_{CB}$ is the collector-base voltage.

The variations in base width give rise to a collector current that changes with collector voltage, which would not happen in an ideal device. The modulation of the base width changes the charge gradient across the base, and consequently the minority carrier current injected from the emitter junction.

The changes in collector current and transistor gain can be represented as $$I_C = I_s\left(1 + \frac{V_{CE}}{V_A}\right)\exp\frac{V_{BE}}{V_T}$$

$$\beta_F = \beta_{F0}\left(1 + \frac{V_{CE}}{V_A}\right)$$

where:
$I_C$=collector current
$\beta_F$=common emitter current gain
$V_{CE}$=collector-emitter voltage
$V_T$=KT/q
$V_A$=Early voltage
$\beta_{F0}$=forward common emitter current gain at zero bias
K=Boltzmann's constant
T=temperature in Kelvin
q=charge of an electron
$I_S$=reverse saturation current
$V_{BE}$=base-emitter voltage.

This is highly undesirable in the formation of transistors used in situations where large amounts of feedback cannot be applied to linearize the device. Such circumstances may arise in RF amplifiers, but is equally applicable in any signal processing path as reduction of non-linearity in the gain stages is always a desirable feature.

The inventors realized that the movement of the depletion region boundaries at the intrinsic base region could be reduced if there was a structure to preferentially deplete against.

Another (less mathematical) way of viewing this situation is that when a reverse bias is applied to the collector-base junction, for every ionized atom in the collector there is an equal but opposite ionized atom in the base. Therefore, as the collector-base reverse bias increases, there are more ionized atoms in the base and this causes the depletion region to spread and hence gives rise to the base width modulation that reduces the Early voltage. However, the inventors realized that it is possible to create a structure that enables the collector charge to be coupled to the structure instead of the base and therefore the base width modulation is reduced.

The depletion region width varies in response to a potential difference at a p-n junction, but this can also be considered as resulting from a potential difference in the vicinity of a boundary of a semiconductor region. This observation by the inventors allowed them to reduce the changes in depletion region width by providing other structures, and hence other features that could give rise to a potential difference between the additional structure and the active collector region of the transistor (the active collector region being adjacent the intrinsic base region) which could moderate the movement of the depletion boundary with collector voltage.

Figure 3:
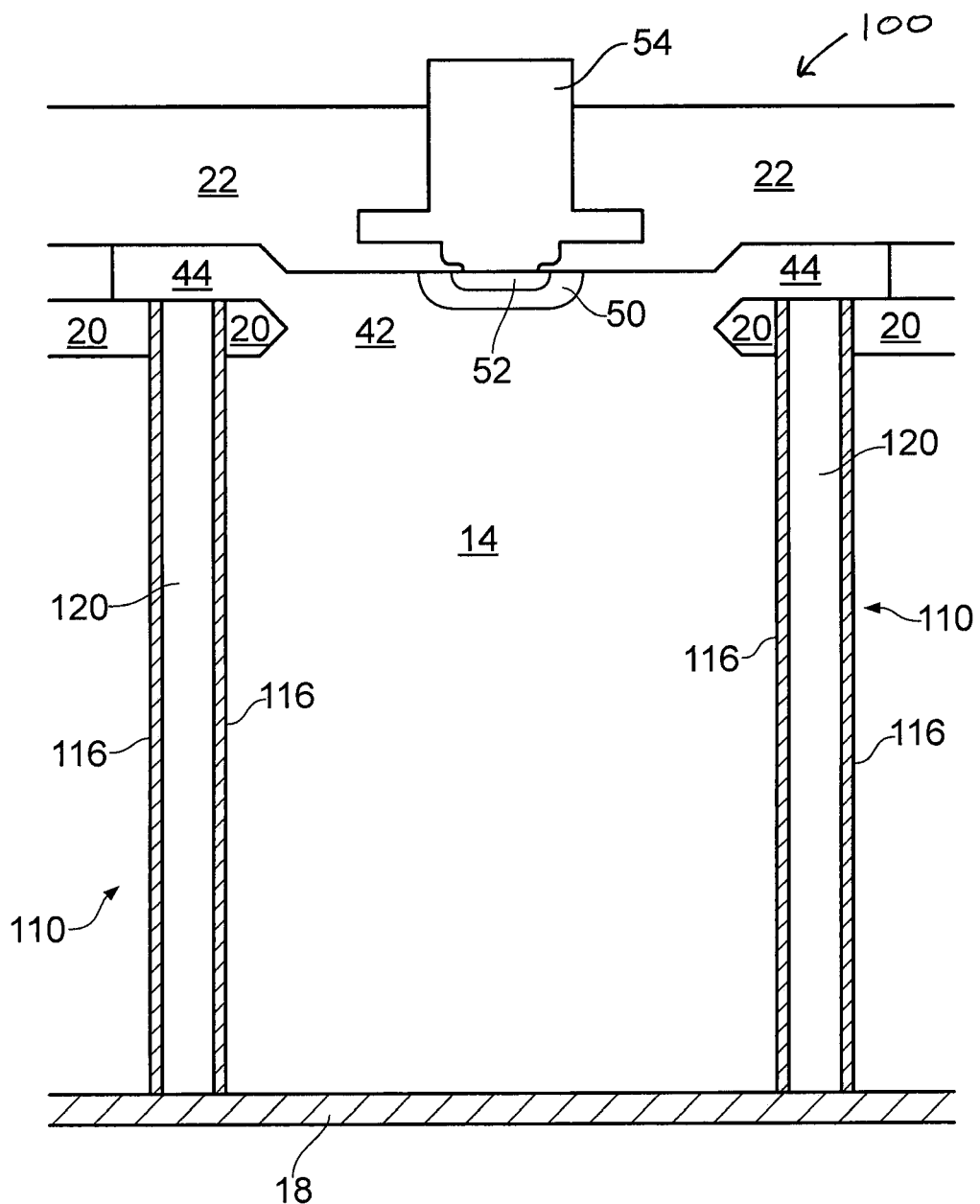
FIG. 3 is a schematic cross-section of a bipolar transistor constituting an embodiment of this disclosure.

FIG. 3 schematically shows an embodiment of a transistor 100 formed in accordance with the teachings of this disclosure. For simplicity, parts which has already been described with respect to FIG. 1 will be given the same reference. The drawing in FIG. 3 can be considered as in a plane perpendicular to the plane of the drawing of FIG. 1 such that the collector contact region 26 and layer 30 are formed either above or below the plane of the figure and consequently are not illustrated. The emitter contact region 52 (and possibly surrounding region 50), together with the intrinsic and extrinsic base regions 42 and 44, and the emitter and base vias 54 and 56 respectively, may be formed as described hereinbefore. Similarly, the bulk collector region and the collector contact 26 and collector via 30 may also be formed as described hereinbefore. However, the transistor is modified either by modifying the construction and position of the insulating walls 16 such that they are nearer the base region 42, or by providing additional features closer to the intrinsic base region 42, and leaving the insulating walls 16 in their normal positions. With either of these modifications, an electrode together with an insulating wall between the electrode and the base-collector interface, can serve as a charge control structure. In FIG. 3 it will be assumed that the position of the insulating walls 16 has been left unchanged and that additional insulating regions have been provided as will now be discussed. These additional insulating regions act as charge control structures 110.

In the conventional silicon on insulator transistor structure, the vertical walls 16 are formed by trenching down through the bulk region 14, which can be silicon, and growing an insulating region into the trench, for example by deposition of silicon oxide. In the arrangement shown in FIG. 3, the charge control structures are formed by a process of trenching down through the bulk region 14, but now the silicon oxide is formed as a relatively thin layer designated 116 on the sides of the trench. Such a relatively thin layer 116 may be formed as a thermal oxide or other dielectric material. As illustrated, the relatively thin layer 116 only occupies a relatively small volume of the trench, and the remaining volume of the trench is filled with a conductive material 120. The conductive material 120 can generally be referred to as an electrode or a conductor. A suitable conductive material 120 is doped polysilicon.

When the charge control structure 110 is sufficiently close to the base-collector junction of the transistor 100, a voltage differential between the electrode of the charge control structure 110 can create an electric field to assist with base-collector depletion spreading that dilutes the internal bipolar electric field across the base-collector junction.

The doping of the collector of the transistor 100 can be balanced to allow the electric field from the electrode of the charge control structure 110 to influence a conduction path of the transistor 100. A thickness of the insulating sidewall 116 between the conductive material 120 and the base-collector interface can be selected so as to ensure a relatively strong electric field from the conductive material 120 is present at the base-collector interface. The strength of the electric field from the electrode of the charge control structure 110 can be controlled such that inversion occurs along the boundary of the dielectric material of the insulating sidewalls 116. The electric field assisted depletion region can influence the current flowing through the relatively low doped collector region while being sufficiently weak in the relatively highly doped collector region to avoid impact ionization.

Depletion spreading from a boundary of dielectric insulating sidewalls and the electrode of the charge control structure 110 can move across the active base-collector region. Having electrodes in charge control structures 110 on opposing sides of the base-collector interface can enable depletion region spreading from both directions and therefore may allow higher collector doping. Electrodes in charge control structures 110 on opposing sides of the base-collector interface can achieve depletion spreading with larger spacing between the charge control structure 110 and the base-collector interface, which can avoid defects in manufacturing.

Figure 4:
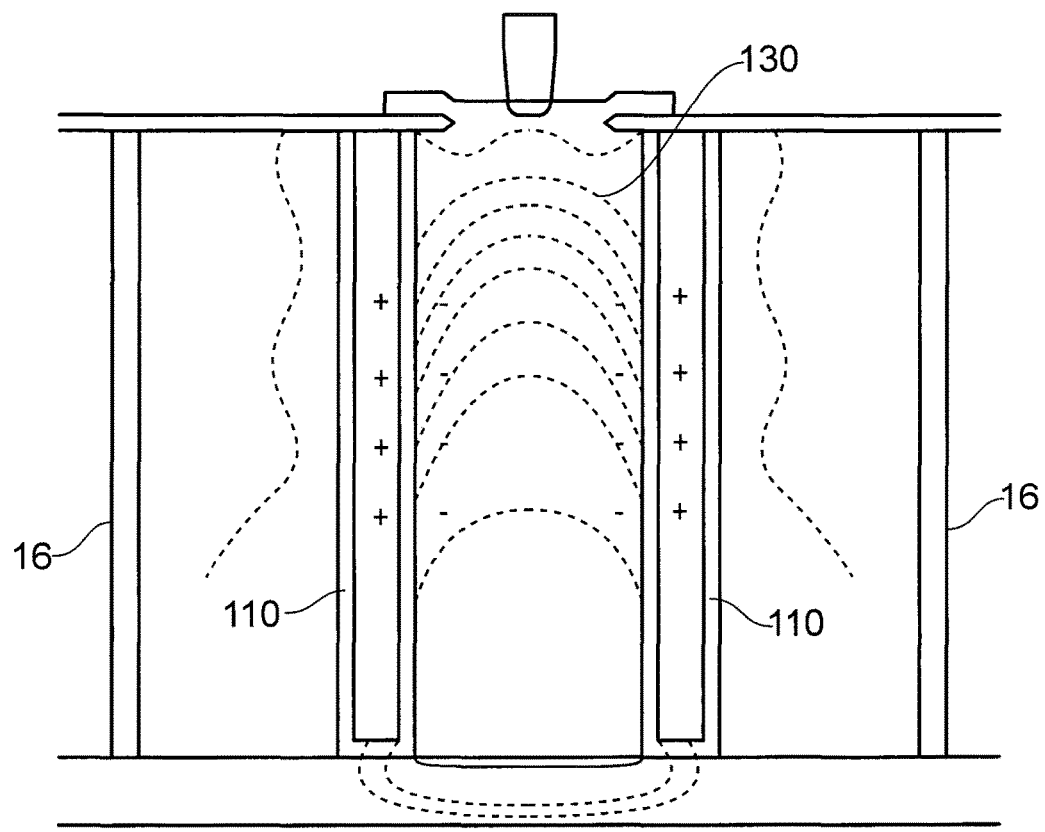
FIG. 4 is a representation of equipotentials within the device of FIG. 3 when it is in use.

FIG. 4 schematically shows equipotentials within the device of FIG. 3. The provision of the conductive material 120 relatively close to the intrinsic base region, but insulated therefrom, forms a charge control structure which modifies the formation of charged regions, and consequently the shape of the depletion regions, within the transistor.

The conducting region 120 within the charge control structure 110 may be left electrically floating or it may be biased to a bias voltage. If the conducting region 120 is left floating, then charge coupling can occur with the silicon on the opposite side of the charge control structure 110 and can consequently benefit from a relatively large "guard area" of silicon around the additional charge control structure 110.

If the insulating wall 16 is repositioned to be adjacent the base (and hence to take the place of the charge control structure 110), then it may be undesirable to use the guard area for the formation of other transistors. However, controlling the potential at the conducting region 120 (or on the opposing side of wall 16 where this approach is used) can provide a stronger charge coupling mechanism and allow for the device size to be reduced.

The conductive material 120 in the charge control structure 110 may have a contact made to it such that it can be connected to a bias voltage, such as the positive supply rail for a PNP device or the negative supply rail for an NPN device.

Specifically, the provision of the charge control structures 110 can enable the depletion region to be modified such that the equipotentials, for example equipotential 130, are preferentially driven down towards the bottom of the collector region at its edges adjacent the charge control structure 110, and as a result movement of the depletion region boundary in the vicinity of the intrinsic base of the transistor can be reduced.

Figure 5:
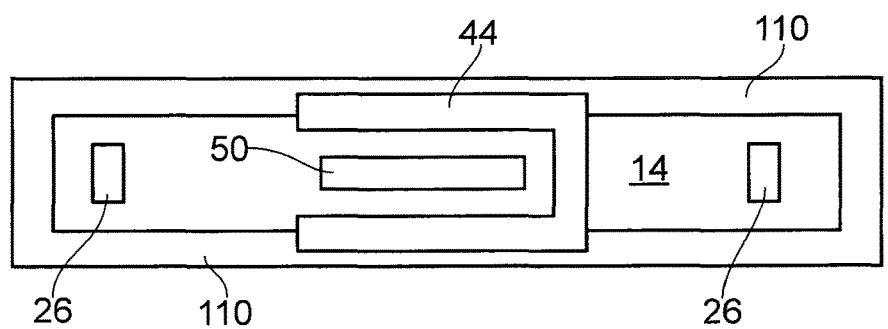
FIG. 5 is a plan view of a transistor constituting an embodiment of this disclosure.

FIG. 5 is a plan view of the transistor structure illustrated in FIG. 3. As can be seen, the transistor of FIGS. 3 and 5 is formed as an elongate structure such that portions of the charge control structure can pass close to the emitter region 50 and consequently be adjacent the intrinsic base region. As illustrated, the extrinsic base 44 can have a U shape in plan view. Collector contacts 26 may be formed at either end of the transistor and connected together by a metallic interconnect (not shown).

Figure 6:
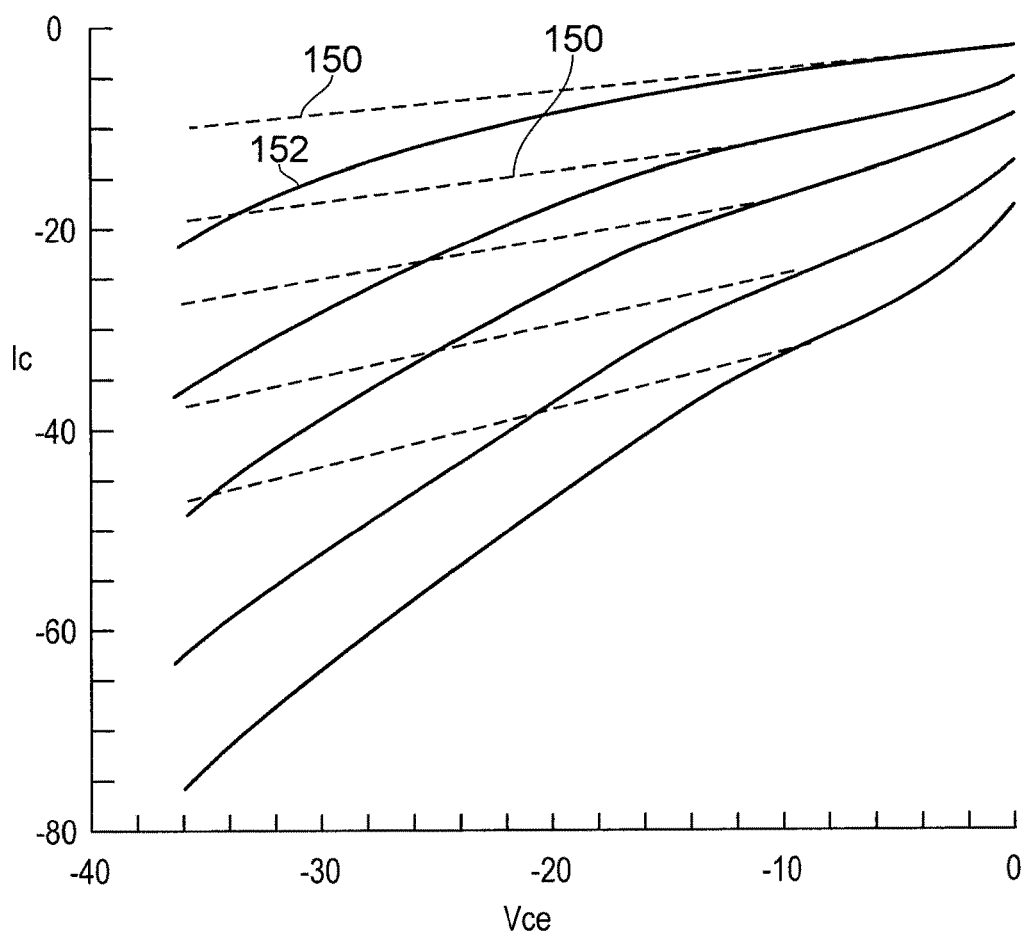
FIG. 6 is a graph of collector current versus collector-emitter voltage.
Figure 7:
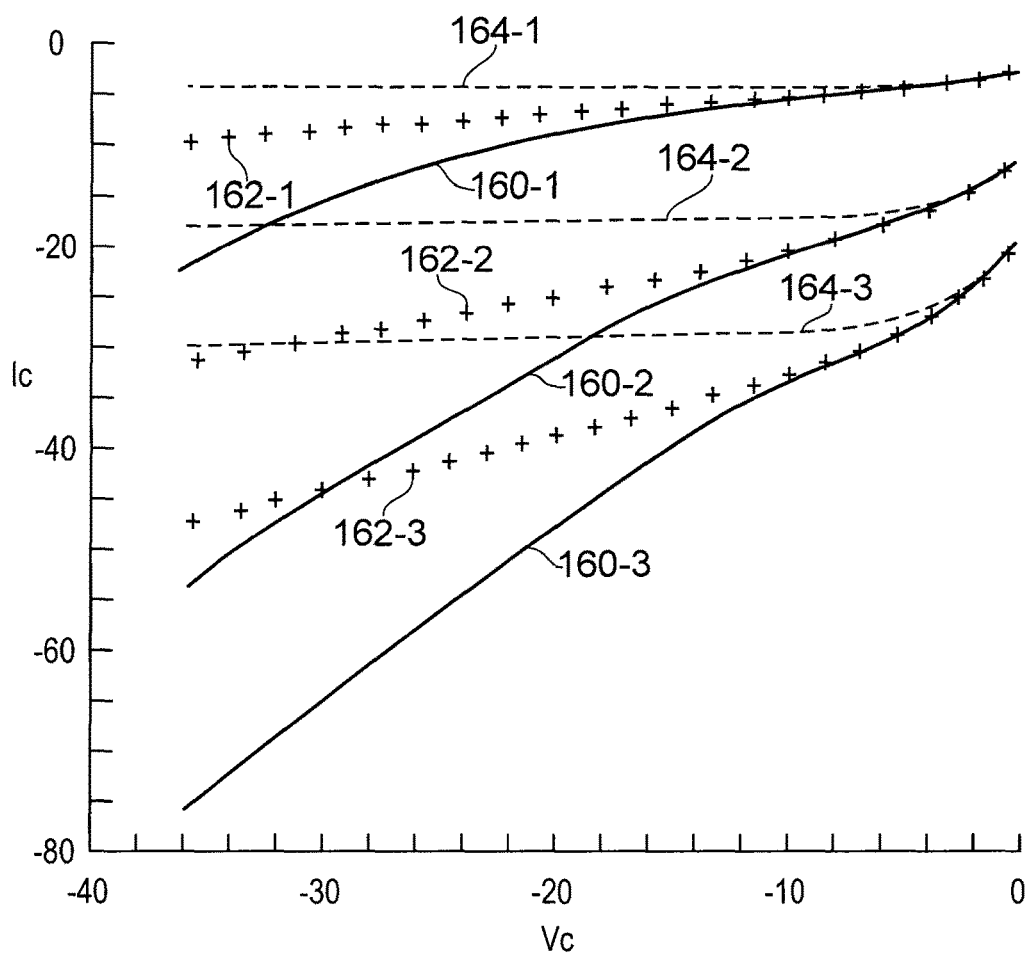
FIG. 7 is a further graph of collector current versus collector-emitter voltage.

FIG. 6 is a graph showing collector current, in arbitrary current units, against collector to emitter voltage for the transistor of FIG. 1, whose voltage-current characteristics are shown by solid lines, and for a transistor formed in accordance with this disclosure, whose voltage-current characteristics are shown by chain lines. Other parameters of the device, such as size and doping concentration are left unaltered. It may be seen that at low (small magnitude) collector-emitter voltages, the transistors perform in substantially the same way. The responses are plotted for a variety of base currents. However, as the potential difference between the collector and emitter increases, the current in the prior art device starts to increase more rapidly with changes in the collector-emitter voltage than is the case in the transistor formed in accordance with the present disclosure. As known to a person skilled in the art, these lines can be extended back so as to cross the voltage axis corresponding to zero collector current, and this defines the Early voltage $V_A$. It can be seen that the chain lines 150 have a much lesser gradient at large potential differences than the solid lines 152 of the transistor 10 shown in FIG. 1, and from this it can be inferred that the early voltage $V_A$ for the transistor shown in FIG. 3 is significantly higher than the early voltage of the unmodified device. This gives rise to a substantial reduction in variation of gain with respect to variation of collector to emitter voltage and hence the transistor exhibits reduced harmonic distortion. FIG. 7 compares the performances of the transistor shown in FIG. 1, whose responses are indicated by the solid lines 160-1 to 160-3. The responses of a transistor as shown in FIG. 3, but where the conductive material 120 in the trenches is left floating is represented by the lines designated as a series of "+" 162-1 to 163-3. Finally, the responses of the transistor when the charge control structure 110 is tied to the opposite potential of the collector are represented by chain lines 164-1 to 164-3. It can be seen that the gradients of the responses show a further reduced dependence on the collector voltage, and hence the early voltage is further increased.

Figure 8B:
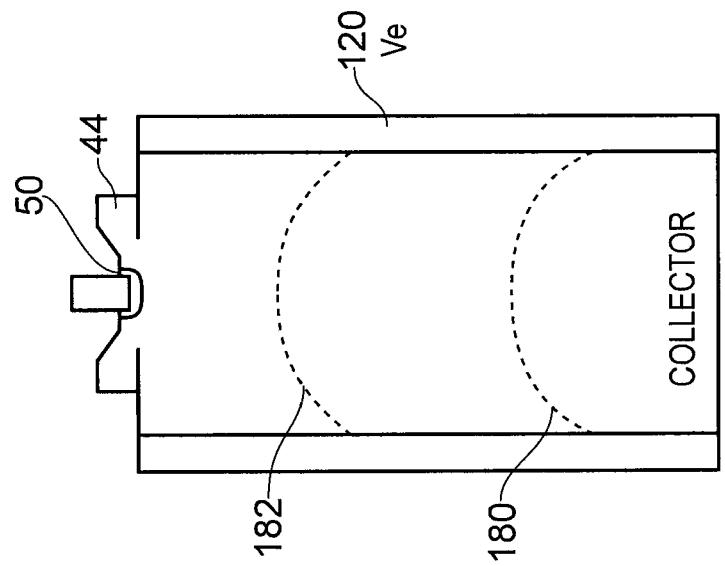
FIGS. 8a and 8b compare equipotentials in a prior art transistor and a transistor in accordance with this disclosure, but with both transistors simulated as being the same width so as to show the benefit of providing a conducting charge control structure.
Figure 8A:
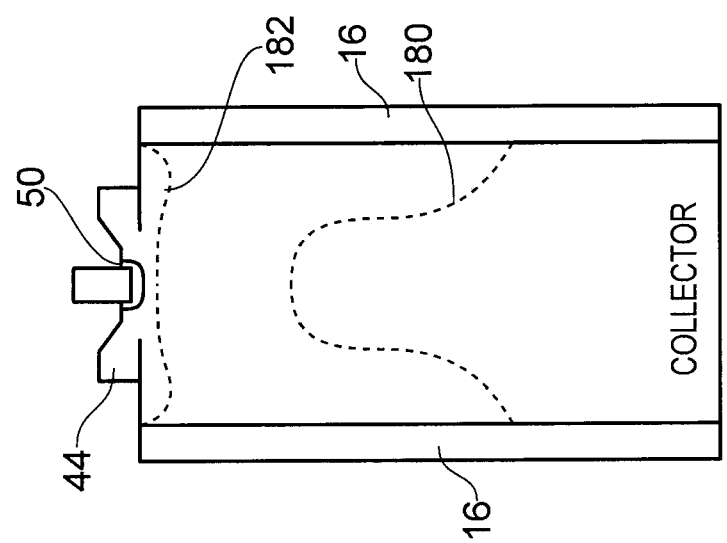

FIGS. 8a and 8b schematically illustrate the modification of the position of equipotential voltages for a device as shown in FIG. 3 when the charge control structure 110 is floating, as shown in FIG. 8a, compared to when the charge control structure is tied to ground, as shown in FIG. 8b. Similar equipotentials in each case are shown by lines 180 and 182 and each of these equipotentials is moved away from the intrinsic base region and toward the collector region. This is particularly significant in the case of equipotential 182 which is a relatively low voltage equipotential because it means the electric field gradient acting across the intrinsic base-collector junction is much reduced and hence there is much less modulation of the base width as a result of change in collector voltage as well as a higher breakdown voltage. Simulations by the inventors for changes in base width between the prior art transistor and transistors according to the present disclosure confirm that over a 0 to 40 volt range the base width in transistors formed in accordance with the present disclosure is substantially invariant, whereas transistors formed in accordance with the prior art have their base width reduced by approximately one half.

FIG. 9 compares the gain versus collector-emitter voltage for a transistor constituting an embodiment of this disclosure against a prior art device of the type described with respect to FIG. 1. The transistor in accordance with this disclosure has a response characteristic designated by a line 200, whereas the prior art device has a gain characteristic designated by a line 202. It can be seen that for all collector-emitter voltages the gain of transistors formed in accordance with this disclosure can be made significantly higher than the prior art. In testing device gains varied between approximately 300 and 430, and line 200 represents the performance of a single device for clarity. For the prior art devices gains of between 60 to 100 were observed, with a typical gain being about 80. Typically, over the collector voltage range of −6 to −36 volts, the gain of the prior art device would vary by about 25. Thus at about −6 volts the gain be approximately 55 rising to approximately 80 at −36 volts. This constitutes a gain variation of approximately 45%. For a device formed in accordance with the present disclosure the gain variation over a similar range was approximately 20, being around 360 times at −6 volts and about 380 times at −36 volts. This represents a gain variation of just under 6%. This is a significant improvement, and indeed over a range between −16 volts and −36 volts the gain only varies by approximately 10 or so.

Figure 10:
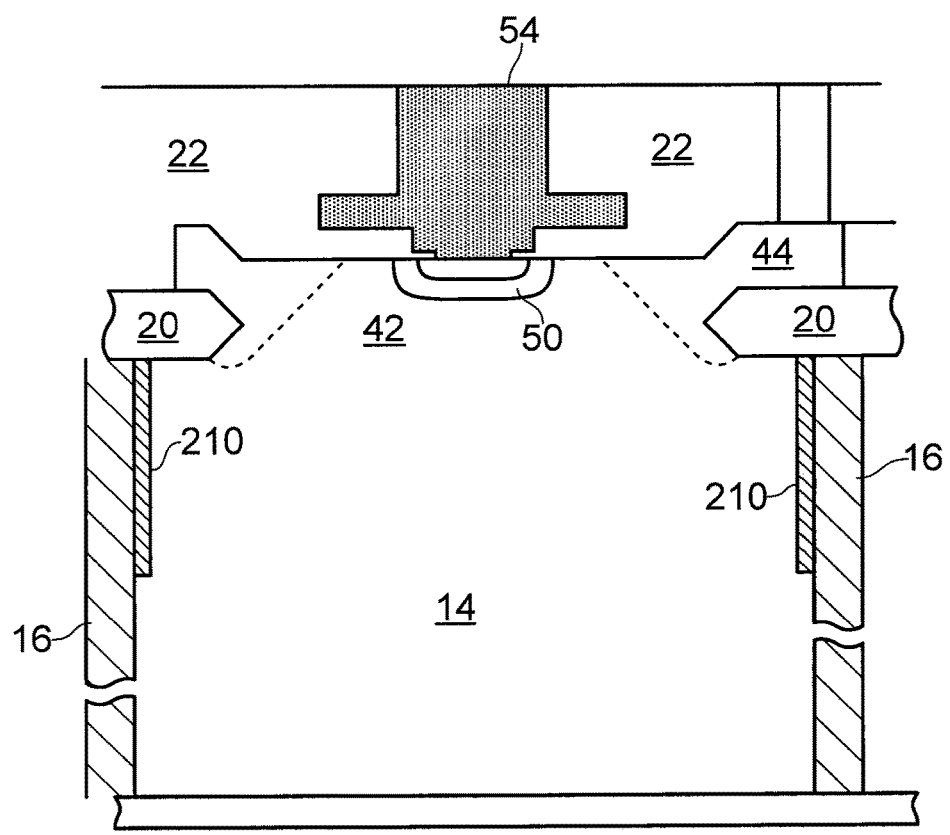
FIG. 10 is a cross section through another embodiment of this disclosure.

In a further variation, shown in FIG. 10, the walls of the trenches adjacent the base-emitter region may be implanted with donors (or acceptors) as appropriate, to form semiconductor regions of the opposite type to the collector. Thus, in the case of a p-n-p transistor the walls of the trenches are implanted with donor impurities to form n-type inserts. Having completed this, the trench may then have an insulator formed within it. The insulator may form a thin wall on the sides of the trenches, for example a wall 116 as shown in FIG. 3, and then the trenches can be filled with a conductive material. Alternatively, the entirety of the trench can be filled with an insulator, such as silicon oxide.

Implanting the uppermost regions of the trench is practical and can be achieved merely by tilting the semiconductor die by a couple of degrees away from the normal axis to the ion beam used to implant the semiconductor. In an arrangement shown in FIG. 10 the implanted regions 210 are formed against a trench filled with insulating material 16. In an embodiment of the transistor of FIG. 10, the doping concentration of the implanted regions 210 was greater than $1 \times 10^{17}$ donor atoms per centimeter cubed.

Figure 11:
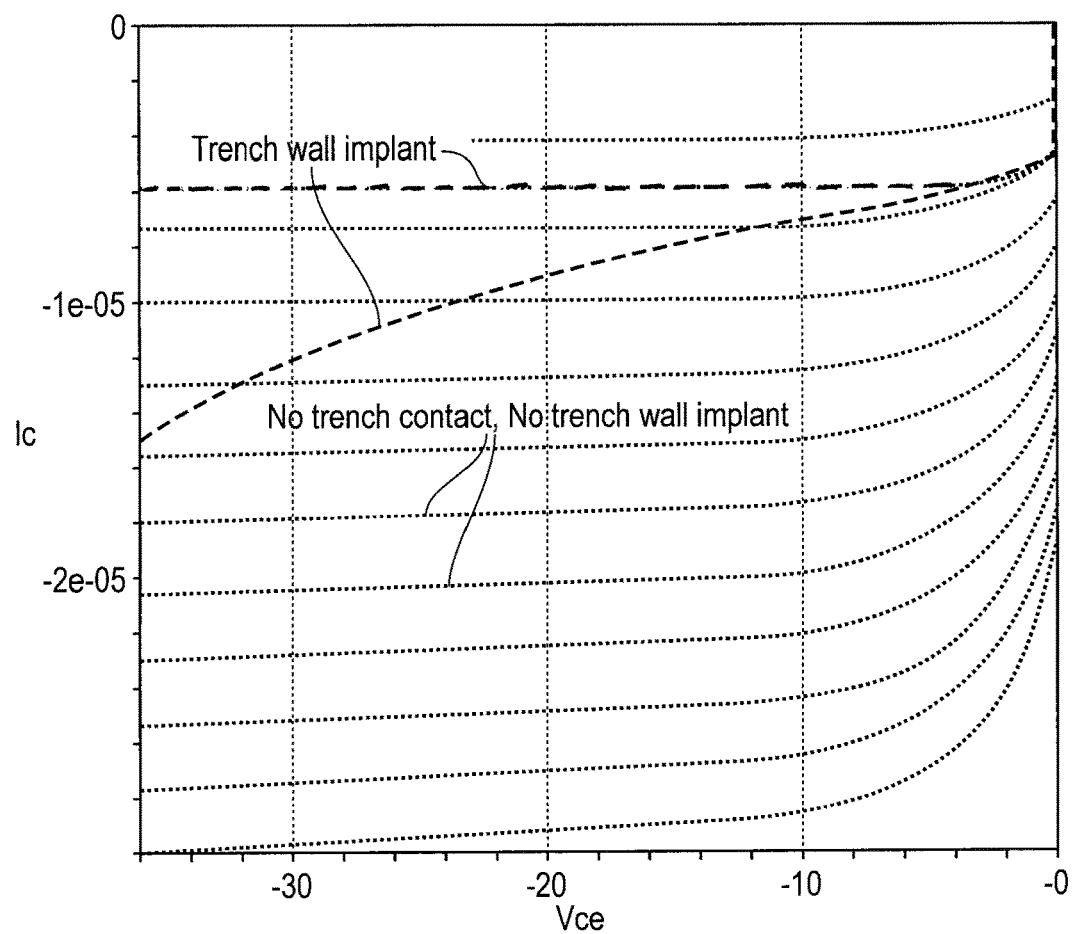
FIG. 11 is a plot of collector current versus collector-emitter voltage for different embodiments of this invention.

FIG. 11 is a plot comparing the performance of a device having the implants 210 compared to a similar device having the charge control structure formed within the trench, but not connected to the emitter contact. The devices having the implants 210 acting as the charge control structures exhibit improved performance compared to the prior art devices. In certain applications, arrangements having the electrically conductive structure formed within the trench are preferable to devices with the implants 210 acting as the charge control structures. Of course, these two approaches can be combined in a single device.

Figure 12:
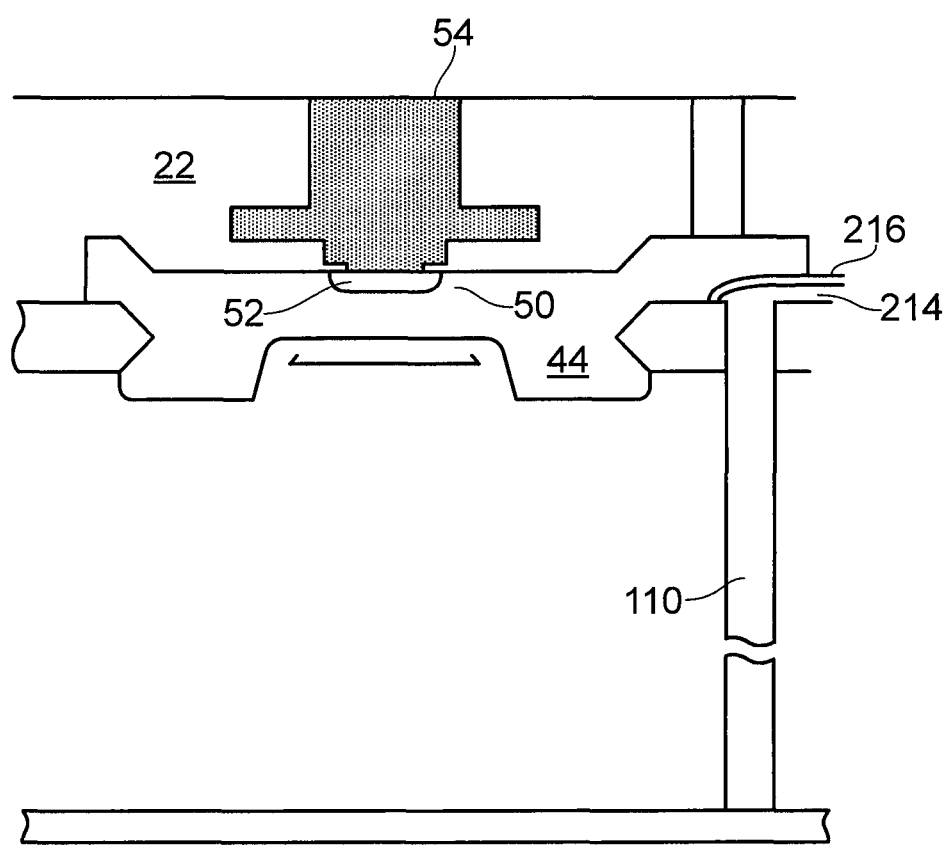
FIG. 12 is a plot of a further variation, which can be applied on conjunction with the other embodiments where the base width is varied.

Additionally, it is possible to modify the shape of the extrinsic base region to drop it partially into the collector region. Such an arrangement is shown in FIG. 12, and the spacing between either side of the extrinsic base can be controlled during formation of the aperture which defines the base and emitter regions. FIG. 12 also shows that the conductive polysilicon of the charge control structure 110 can be extended to a contact region 214 also of polysilicon that is isolated from the base 44 by a layer of oxide 216 or some other suitable dielectric.

Figure 13:
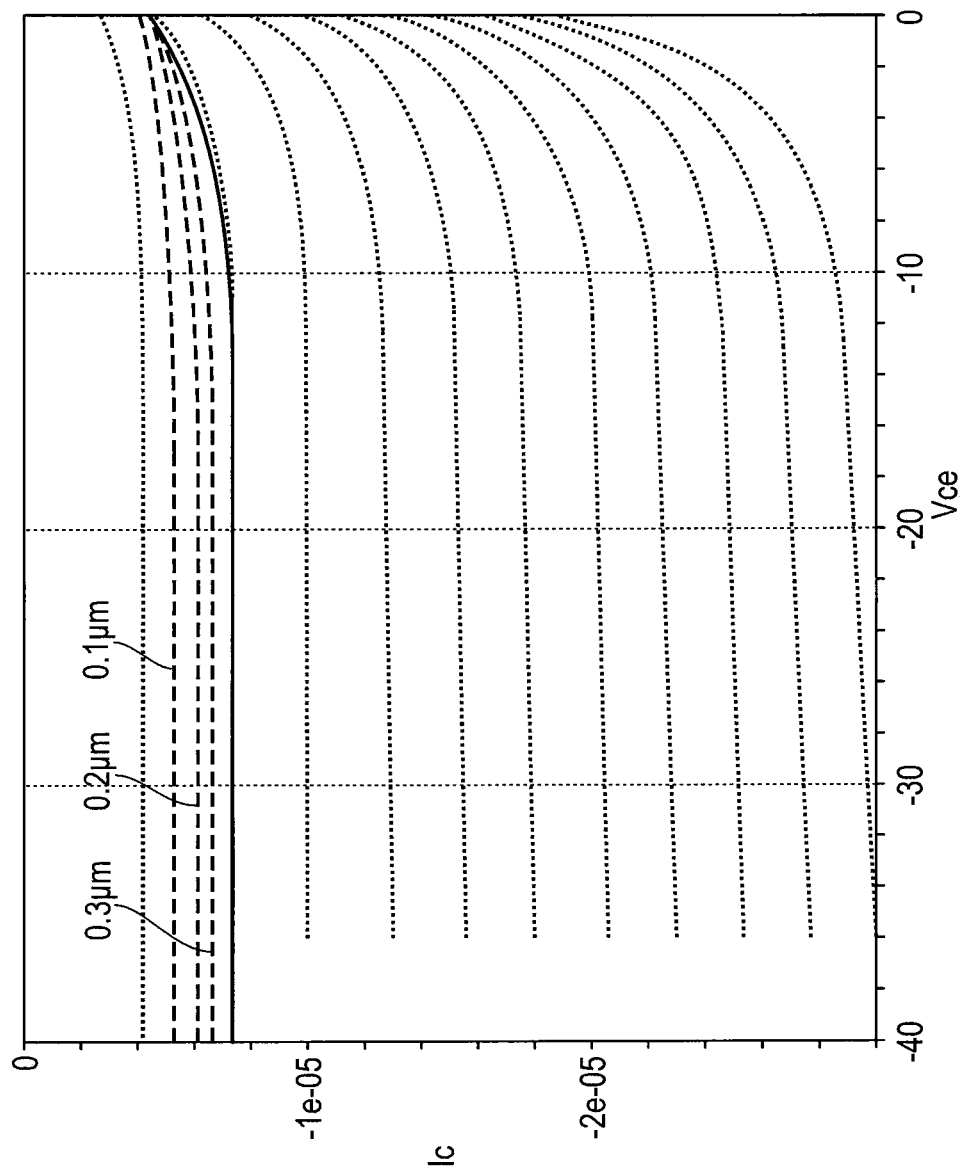
FIG. 13 is a plot showing how the width of the base alters the current versus collector-emitter voltage characteristic.

FIG. 13 is a graph showing the performance of a device with changes in the spacing between the extrinsic base regions. In general, although it can be hard to observe, relatively narrow spacings between the extrinsic base regions are better than wider spacings. This is because the wider spacings effectively move the charge control structures further away from the base-collector interface.

Typically the trenches in which charge control structures are formed have a width of 1-2 microns. Where a trench is implanted with polysilicon, it can be difficult to make a connection to the polysilicon within the trench. However the inventors realized that this can be overcome by leaving the polysilicon within the trench such that it has a relatively rough upper surface, and then forming an epitaxial contact region above the polysilicon in the trench. The epitaxial process naturally allows the silicon that has been deposited to combine with and make a good contact to the polysilicon in the trench.

Figure 14:
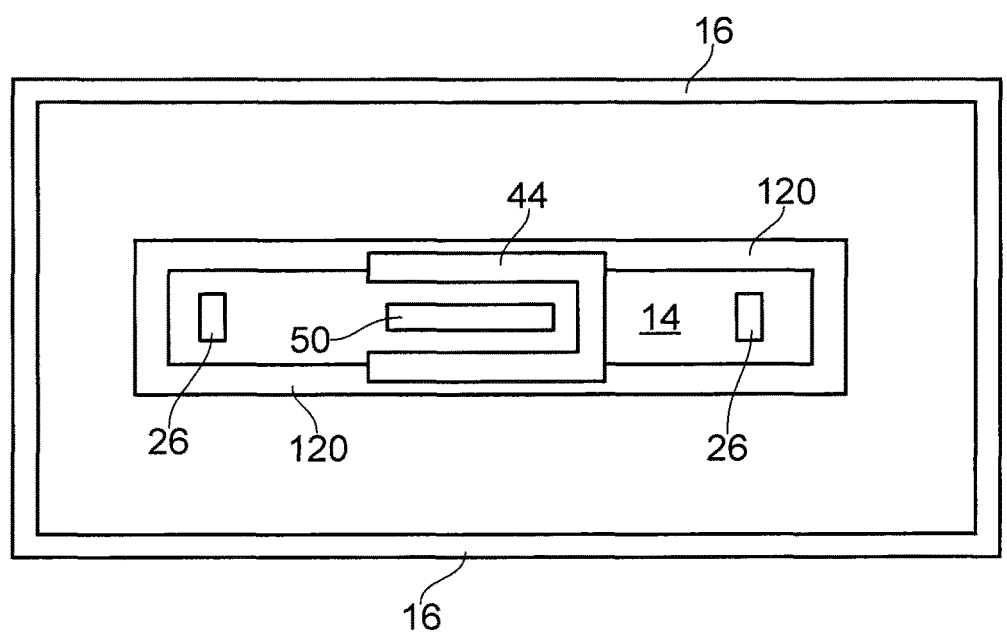
FIG. 14 is a plan view of a further variation of an embodiment.

As noted before, the charge control structure may be formed separately from the walls that separate one transistor from adjacent transistors. Certainly it is shown in FIG. 14 where the device layout of FIG. 5 is formed within a p-type well delimited by buried insulating walls 16.

Figure 15:
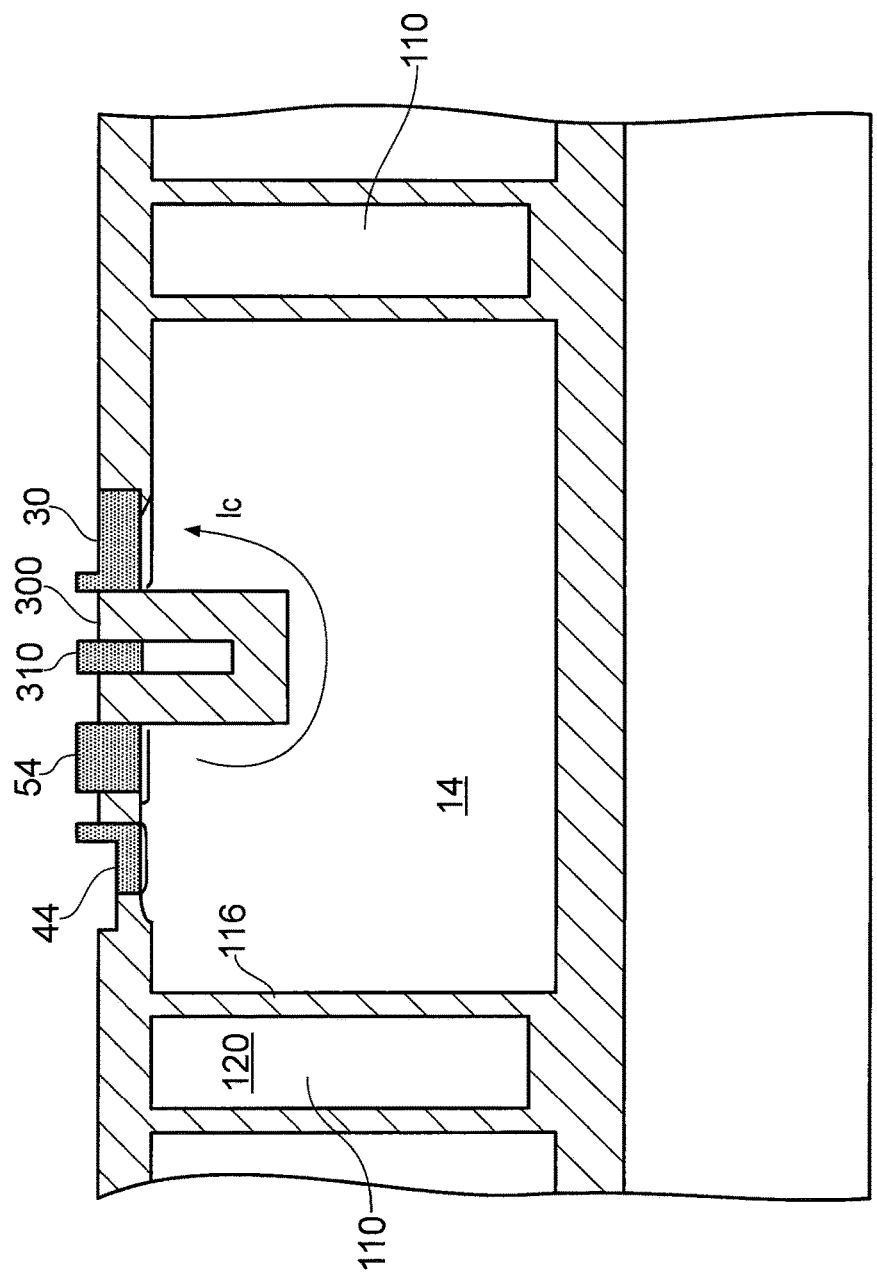
FIG. 15 is a schematic cross section through a further embodiment of a transistor of this disclosure.

FIG. 15 shows a further variation where the transistor structure is modified by the inclusion of a dielectric trench 300 having a conductor 310 formed therein so as to replicate the functionality of the charge control structures described hereinbefore but in a horizontal transistor or substantially horizontal transistor structure.

It is thus possible to provide a modified bipolar transistor having enhanced gain, Early voltage, and breakdown voltage with a reduced distortion over a range of collector voltages. This makes gain spreads more uniform and facilitates circuit design. Thus a 70V process may exhibit the gain spread of a 30V process. In a further embodiment the transistor, or an integrated circuit containing one or more of the transistors described herein may include a voltage generator such as a charge pump for generating a voltage outside of the device supply rails as a bias voltage to be applied to the charge control structure. Thus, returning to FIGS. 6 and 7, the transistors described were very linear, with a slight curve in their response when $V_C$ had a magnitude of only a few volts. This also means that the voltage difference between the semiconductor material of the collector and the potential of the charge control structure was only a few volts. If this potential is increased, for example by biasing the charge control structure of a PNP transistor a few volts more positively than the emitter voltage or the supply rail, then the charge control structure ensures linearity of the device right down to $V_C$ being nearly 0V. A similar approach can be used with NPN devices, but biasing the charge control structure negatively. Such voltages can be provided by charge pumps or other voltage converters.

Although the disclosure has been in the context of a PNP transistor, the relative dopings may be swapped so as to form an NPN transistor.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values or distances provided herein are intended to include similar values within a measurement error.

While certain embodiments of the have been described, these embodiments have been presented by way of example only, and are not intended to limit the scope of the disclosure. Indeed, the novel transistors, devices, apparatus, systems, and methods described herein may be embodied in a variety of other forms. Furthermore, various omissions, substitutions and changes in the form of the transistors, devices, apparatus, systems, and methods described herein may be made without departing from the spirit of the disclosure. The accompanying claims are intended to cover such forms or modifications as would fall within the scope and spirit of the disclosure. Accordingly, the scope of the present inventions is defined by reference to the claims. Although the claims have been presented in single dependency format suitable for filing at the USPTO, it is to be understood that any claim can depend on any preceding claim of the same type, except where that is clearly not technically feasible.

The invention claimed is:

1. A bipolar transistor with a reduced variation in collector current as collector voltage changes, the bipolar transistor comprising:

an emitter region;
a collector region having a same conductivity type as the emitter region;
a base region comprising: an intrinsic base region and an extrinsic base region extending from the intrinsic base region, wherein the extrinsic base region is configured to conduct base current between a base contact and the intrinsic base region, wherein the intrinsic base region separates the extrinsic base region from the emitter region, wherein the intrinsic base region separates the extrinsic base region from the collector region, and wherein the emitter region, the base region, and the collector region are included in the bipolar transistor; and
a charge control structure disposed adjacent a base-collector interface, wherein the charge control structure comprises an electrode adjacent to and dielectrically isolated from the base and collector regions, wherein the charge control structure is dielectrically isolated from a bulk region, wherein the extrinsic base region overlaps in plan view above at least a portion of the charge control structure; and
wherein the charge control structure is positioned sufficiently close to the base-collector interface such that a voltage applied to the electrode creates an electric field that reduces variations in a base-collector depletion width that occur responsive to changes in base-collector voltage when the base region is reverse biased with respect to the collector region.

2. A bipolar transistor as claimed in claim 1 in which the electrode comprises a doped semiconductor region.

3. A bipolar transistor as claimed in claim 1 in which the electrode surrounds the intrinsic base region and at least part of the collector region.

4. A bipolar transistor as claimed in claim 1, in which the charge control structure is positioned within a first distance from an edge of the intrinsic base region of the bipolar transistor such that an effective width of the intrinsic base region is substantially invariant over a 40 Volt range for a collector-emitter voltage when the base region is reverse biased with respect to the collector region, wherein the effective width is based on a width of the intrinsic base region and the base-collector depletion width.

5. A bipolar transistor as claimed in claim 4, further comprising insulating walls surrounding the bulk region and configured to electrically isolate the bipolar transistor, wherein the charge control structure is positioned within the insulating walls, and wherein at the charge control structure is separated from the insulating walls by an area comprising silicon.

6. A bipolar transistor as claimed in claim 1 in which a dielectric wall extends around the base region of the bipolar transistor, the dielectric wall causing the dielectric isolation of the electrode from the base and collector regions.

7. A bipolar transistor as claimed in claim 6 in which the bipolar transistor is formed on a first side of the dielectric wall, and the electrode is formed on a second side of the dielectric wall, wherein the dielectric wall extends to a dielectric layer at a bottom of the bipolar transistor.

8. A bipolar transistor as claimed in claim 7 in which a second dielectric wall is provided such that the electrode is bounded by the first and second dielectric walls such that the electrode is dielectrically isolated from a semiconductor well delimited by the second dielectric wall.

9. A bipolar transistor as claimed in claim 1 in which the electrode is connected to a bias node arranged to provide a voltage to the electrode.

10. A bipolar transistor as claimed in claim 1 in which the bipolar transistor is a vertical bipolar transistor, and wherein the vertical bipolar transistor is elongate so as to allow the collector region to be brought to a connector plane of the vertical bipolar transistor.

11. A bipolar transistor as claimed in claim 1, in which the charge control structure comprises a doped region of semiconductor of opposite conductivity type to the collector region.

12. A bipolar transistor as claimed in claim 1, in which the electrode of the charge control structure comprises doped polysilicon having a boundary extending perpendicular to the base-collector interface.

13. A bipolar transistor as claimed in claim 1 in which the extrinsic base region is located on a side of the intrinsic base region, the extrinsic base region extending further away from the emitter region than the intrinsic base region extends away from the emitter region along a direction substantially parallel to a top layer of the bipolar transistor.

14. A bipolar transistor as claimed in claim 1 wherein:
an insulating wall surrounds the bipolar transistor in plan view;
the electrode is dielectrically isolated from the base and collector regions by dielectric sidewalls;
a first portion of the charge control structure extends substantially parallel to an axis extending from the base region to the collector region along a length of the axis between the base region to the collector region;
a second portion of the charge control structure extends substantially parallel to the axis along the length of the axis between base region to the collector region;
the bipolar transistor is a vertical bipolar transistor;
the first and second portions of the charge control structure runs along opposite sides of the axis;
the charge control structure is at least as long as a distance from the base region to the collector region; and
the charge control structure extends vertically.

15. A bipolar transistor as claimed in claim 1, wherein the charge control structure is configured to influence a base-collector depletion region of the bipolar transistor.

16. A bipolar transistor as claimed in claim 1, further comprising:
a second collector region of the bipolar transistor,
wherein the collector region and the second collector region are positioned on opposite sides of the emitter region.

17. An integrated circuit or an amplifier comprising a vertical bipolar transistor with reduced variation in effective base width as collector voltage changes, wherein the vertical bipolar transistor comprises:
an emitter region of a first conductivity type;
a base region of a second conductivity type, the base region comprising: an intrinsic base region and an extrinsic base region extending from the intrinsic base region;
a collector region of the first conductivity type; and
a charge control structure disposed adjacent a base-collector interface, wherein the charge control structure comprises an electrode adjacent to and dielectrically isolated from the base and collector regions, wherein the charge control structure is dielectrically isolated from a substrate over which the vertical bipolar transistor is disposed, wherein the extrinsic base region overlaps above at least a portion of the charge control structure in plan view, and wherein the charge control structure is positioned sufficiently close to the base-collector interface such that a voltage applied to the electrode creates an electric field that reduces variations in a base-collector depletion width when the base region is reverse biased with respect to the collector region.

18. An integrated circuit or amplifier as claimed in claim 17 comprising the integrated circuit, wherein a charge pump or other voltage translation device is provided in the integrated circuit to bias the charge control structure to a bias voltage outside of voltage range bounded by supply voltage rails provided to the integrated circuit.

19. An integrated circuit or amplifier as claimed in claim 17, wherein the first conductivity type is p-type and the second conductivity type is n-type such that the vertical bipolar transistor in a PNP transistor.

20. A bipolar transistor with reduced variation in collector current as collector voltage changes, comprising:
   an emitter region of the bipolar transistor, the emitter region coupled to a via that extends from the emitter region to a top layer of the bipolar transistor;
   a base region of the bipolar transistor, the base region comprising an intrinsic base region and an extrinsic base region;
   a collector region of the bipolar transistor, wherein the bipolar transistor comprises a base-collector junction;
   a charge control structure positioned such that the extrinsic base region overlaps above at least a part of the charge control structure, wherein the charge control structure comprises an electrode dielectrically isolated from the base and collector regions, wherein the charge control structure is dielectrically isolated from a bulk region, and wherein an insulating wall surrounds the bipolar transistor in plan view.

21. The bipolar transistor of claim 20, further comprising a base contact coupled to the extrinsic base region;
   wherein the extrinsic base region is configured to conduct base current between the base contact and the intrinsic base region;
   wherein the intrinsic base region is configured to conduct current between the emitter region and the collector region;
   wherein the intrinsic base region separates the extrinsic base region from the emitter region; and
   wherein the intrinsic base region separates the extrinsic base region from the collector region.

22. The bipolar transistor of claim 20, wherein the charge control structure is positioned sufficiently close to the base-collector junction to such that variations in a base-collector depletion region that occur responsive to a change in a base-collector voltage are reduced when the base region is reverse biased with respect to the collector region.

* * * * *